United States Patent [19]

Kinoshita

[11] Patent Number: 5,450,035
[45] Date of Patent: Sep. 12, 1995

[54] AUTOMATIC GAIN CONTROL APPARATUS

[75] Inventor: Norihito Kinoshita, Yokohama, Japan

[73] Assignee: Matsushita Electric Industrial Co., Ltd., Osaka, Japan

[21] Appl. No.: 251,926

[22] Filed: Jun. 1, 1994

[30] Foreign Application Priority Data

Jun. 4, 1993 [JP] Japan .................. 5-158049

[51] Int. Cl.⁶ .............................. H03G 3/20
[52] U.S. Cl. ..................... 330/129; 330/279; 455/240.1
[58] Field of Search ............... 330/279, 129; 455/239.1, 240.1, 241.1

[56] References Cited

U.S. PATENT DOCUMENTS 4,890,297  12/1989  Zscheile, Jr. et al. ............ 375/1

FOREIGN PATENT DOCUMENTS 0051472  5/1982  European Pat. Off. .
0366025  5/1990  European Pat. Off. .
2856479  7/1980  Germany ............... 330/279

Primary Examiner—James B. Mullins
Attorney, Agent, or Firm—Lowe, Price, LeBlanc & Becker

[57] ABSTRACT

An automatic gain control apparatus includes a variable gain amplifier 5 to amplify a signal with an amplification factor and a gain controller 6 to control the amplification factor of the variable gain amplifier 5. A gain limiter 7 is provided for restricting the magnitude of the amplification factor within a predetermined range. The amplification factor therefore does not vary largely, even immediately after the input signal level is suddenly changed due to a switching of a transmitter antenna or a carrier frequency. Thus, it is possible to quickly respond to the change of input signal without requiring a large dynamic range in the circuit following the automatic gain control apparatus.

11 Claims, 3 Drawing Sheets

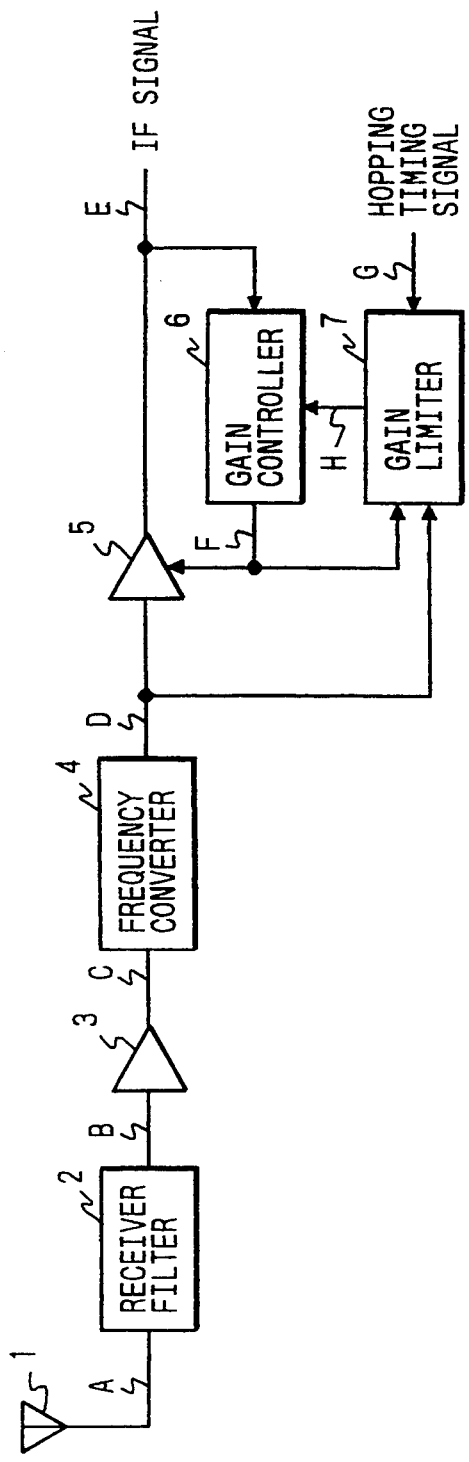
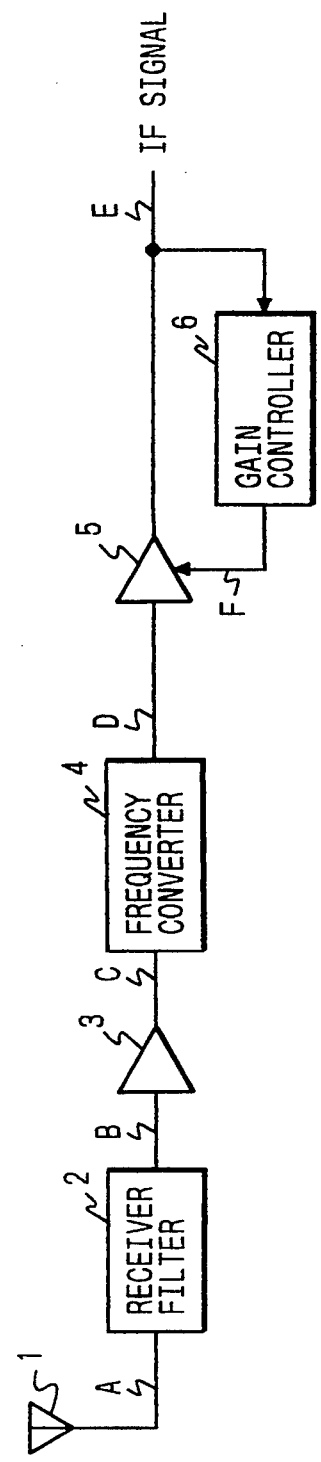
FIG. 1
FIG. 3 PRIOR ART

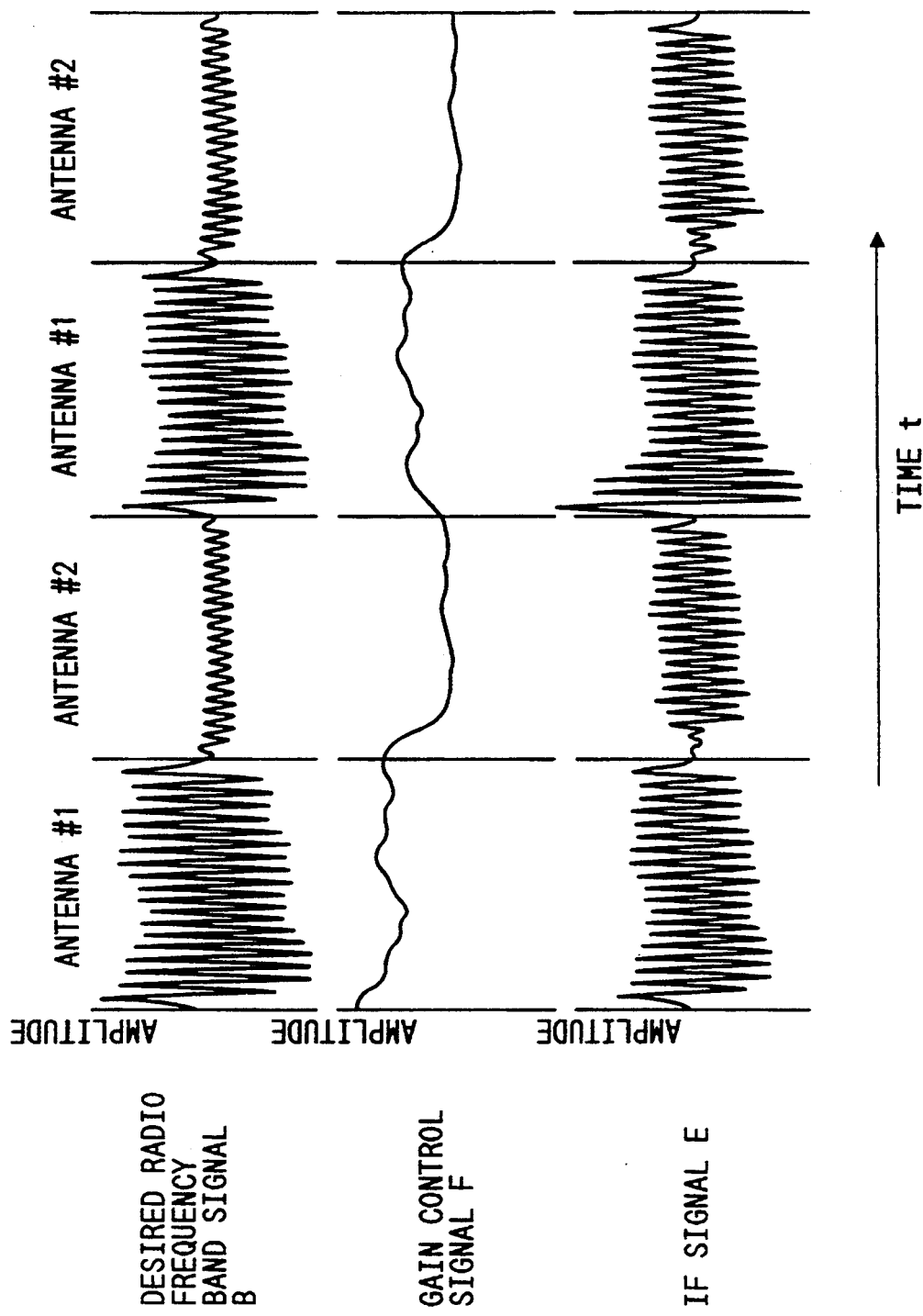

AUTOMATIC GAIN CONTROL APPARATUS

BACKGROUND OF THE INVENTION

1. Field of the Invention

The present invention relates to an automatic gain controller (AGC), preferably used for radio communication receivers, and more particularly to an automatic gain controller (AGC) which is capable of performing an adequate gain control on an input signal whose amplitude is steeply changed.

2. Prior Art

The land mobile communication, such as portable telephones and automobile telephones, is generally subjected to severe electric field environment. To assure stable communication under such severe conditions, digital modulation systems and time division multiplexing (TDM) systems have been recently adopted. Furthermore, employment of transmitter antenna hopping and frequency hopping is now examined.

The transmitter antenna hopping is characterized by antenna extraction among a plurality of antennas provided on a transmitter by which an optimum resultant signal is always obtained even if communication conditions are changed or worsened. Similarly, the frequency hopping is characterized by frequency extraction among a plurality of carrier frequencies for optimization of signal receiving condition.

Meanwhile, radio communication receivers are equipped with automatic gain controllers to adequately respond to the change of input signal derived from variations of electric field environment etc.

A typical conventional radio communication receiver, to perform automatic gain control, comprises, as shown in FIG. 3, a receiver antenna 1 detecting a radio frequency band signal, a receiver filter 2 extracting a desired frequency band signal from the detected radio frequency band signal, a first-stage amplifier 3 amplifying the extracted signal, a frequency converter 4 converting an input signal from radio frequency band to intermediate frequency band, a variable gain amplifier 5 amplifying an intermediate frequency band signal, and a gain controller 6 controlling the variable gain amplifier 5.

According to above-described conventional receiver, the antenna 1 receives the radio frequency band signal A sent from a transmitter (not shown), and outputs this radio frequency band signal A to the receiver filter 2. The receiver filter 2 extracts a desired radio frequency band signal B from the input radio frequency band signal A, and outputs this desired radio frequency band signal B to the first-stage amplifier 3. The first-stage amplifier 3 amplifies the extracted radio frequency band signal B, and outputs an amplified signal C to the frequency converter 4. The frequency converter 4 converts the radio frequency band signal C to an intermediate frequency band signal D, and outputs the intermediate frequency band signal D to the variable gain amplifier 5.

The variable gain amplifier 5 amplifies the intermediate frequency band signal D by varying its amplification factor according to a gain control signal F supplied from the gain controller 6, and generates an IF (intermediate frequency) signal E which is delivered to a next-stage circuit (not shown) and the gain controller 6. The gain controller 6 outputs the gain control signal F to the variable gain amplifier 5 to control the amplification factor of the variable gain amplifier 5 in such a manner that the IF signal E is maintained at constant as time averaged value.

Such a conventional automatic gain controller, however, has a problem that, when the input signal level varies steeply, its automatic control function cannot follow this signal change. More specifically, as shown in FIG. 4, when a radio frequency band signal is transmitted from a transmitter employing antenna hopping system or frequency hopping system, the level of an input signal received by a receiver may vary abruptly in response to switching of transmitter antenna or carrier frequency. The above-described conventional automatic gain control apparatus cannot follow such a sudden change of input signal level.

This is because the gain control characteristic itself includes a time constant. Therefore, when the amplitude of desired radio frequency band signal B suddenly decreases at the time the transmitter's antenna is switched from an antenna #1 to an antenna #2, it requires a significant time until the amplitude of the gain control signal F is decreased correspondingly. The amplification factor of the variable gain control amplifier 5 is increased with reducing amplitude of the gain control signal F. As a result, at the moment immediately after the transmitter's antenna is switched to the antenna #2, the variable gain controller 5 fails to amplify the radio frequency band signal B whose amplitude just became small, rather acting to unexpectedly reduce the amplitude of the signal B.

Similarly, when the amplitude of desired radio frequency band signal B suddenly increases at the time the transmitter's antenna is switched from the antenna #2 to the antenna #1, it requires a significant time until the amplitude of the gain control signal F is increased correspondingly. As a result, at the moment immediately after the transmitter's antenna is switched to the antenna #1, the variable gain controller 5 fails to attenuate the radio frequency band signal B whose amplitude just became large, rather acting to unexpectedly increasing the amplitude of the signal B.

Consequently the amplitude range of IF signal generaged from the variable gain amplifier 5 becomes wide, which requires a circuit following the automatic gain controller to have a very large dynamic range. A signal, therefore, will cause a distortion unless a sufficiently large dynamic range is provided in the circuit following the automatic gain controller.

Eliminating this disadvantage by reducing the time constant is not preferable since the automatic gain control function itself is no longer available.

SUMMARY OF THE INVENTION

Accordingly, in view of above-described problems encountered in the prior art, a principal object of the present invention is to provide an automatic gain control apparatus capable of increasing quality of communication apparatus employing antenna or frequency hopping system, without being adversely effected by sudden change of input signal level and also without requiring a large dynamic range in a circuit following the gain control circuit.

In order to accomplish this and other related objects, the present invention provides an automatic gain control apparatus comprising: variable gain amplification means for amplifying a signal with an amplification factor; gain control means for controlling the amplification factor of the variable gain amplification means; and gain limiting means for restricting the magnitude of the amplification factor within a predetermined range.

In the automatic gain control apparatus of the present invention, it is preferable that the gain limiting means restricts an upper limit and a lower limit of the amplification factor.

It is further preferable that the gain limiting means varies the predetermined range in response to a signal representative of switching of transmitter antenna through which the signal is transmitted or carrier frequency on which the signal is carried.

With above-described arrangement, even if the input signal level is suddenly changed due to switching of transmitter antenna or carrier frequency or the like, the gain limiting means acts to suppress the magnitude of the amplification factor. The amplification factor, therefore, does not vary so widely as was in the conventional system. Accordingly, this invention enables the system to quickly respond to the change. Thus, no large dynamic range is required in the circuit following the gain control circuit.

Furthermore, an automatic gain control will be realized in each receiving burst unit by executing control of amplification factor every time the transmitter antenna or carrier frequency is switched.

BRIEF DESCRIPTION OF THE DRAWINGS

The above and other objects, features and advantages of the present invention will become more apparent from the following detailed description which is to be read in conjunction with the accompanying drawings, in which:

FIG. 1 is a block diagram showing one example of an automatic gain control apparatus in accordance with the present invention;

FIG. 3 is a block diagram showing a conventional automatic gain control apparatus; and FIG. 4 is a waveform chart showing control characteristic of the conventional automatic gain control apparatus.

DETAILED DESCRIPTION OF THE PREFERRED EMBODIMENT

Figure 2:
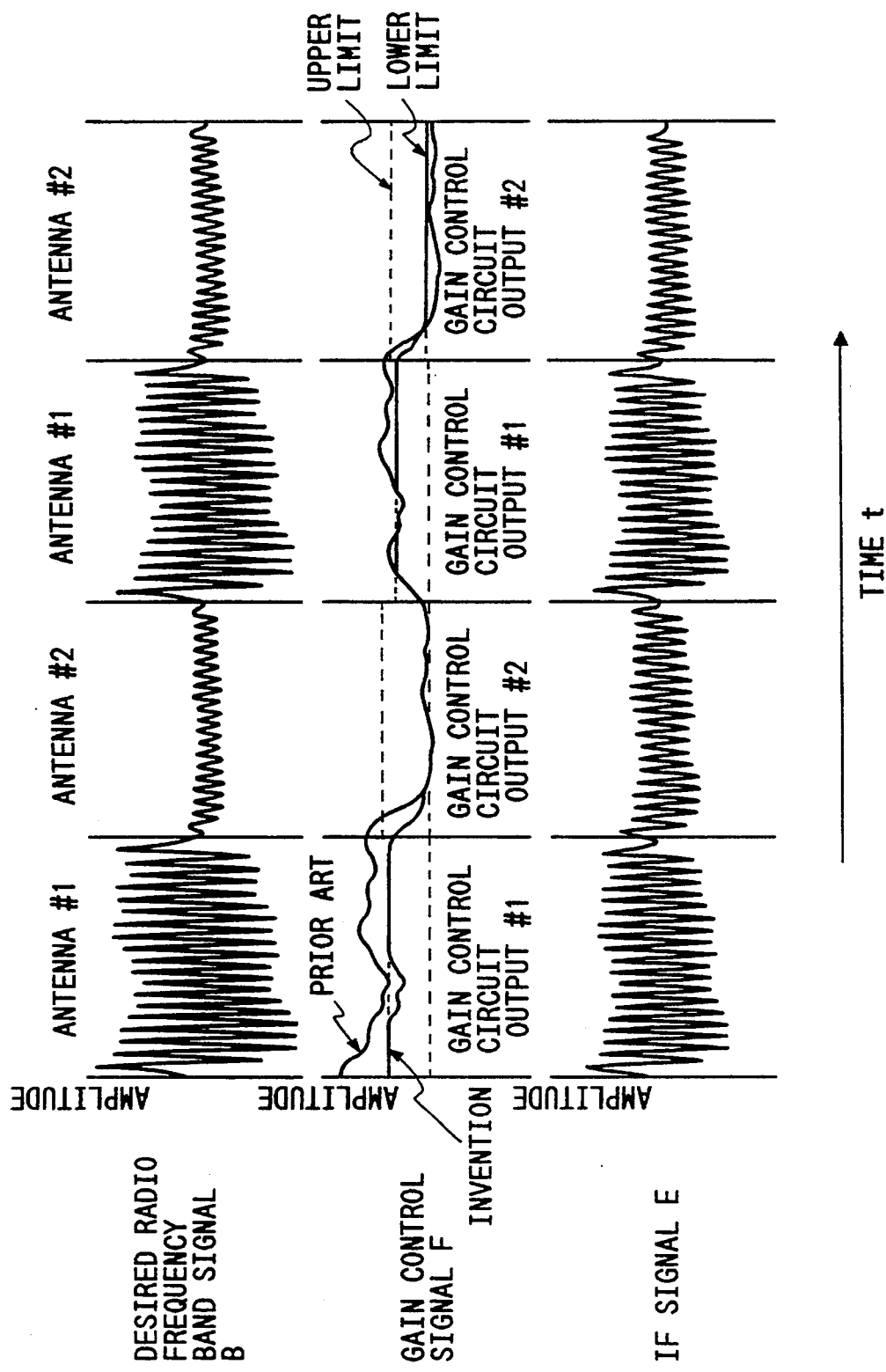
FIG. 2 is a waveform chart showing control characteristic of the automatic gain control apparatus in accordance with the present invention.

Hereinafter, a preferred embodiment of the present invention will be explained in detail with reference to FIGS. 1 and 2.

A radio communication receiver employing the automatic gain control apparatus of the present invention comprises, as shown in FIG. 1, a receiver antenna 1 detecting a radio frequency band signal, a receiver filter 2 extracting a desired frequency band signal from the detected radio frequency band signal, a first-stage amplifier 3 amplifying the extracted signal, a frequency converter 4 converting an input signal from radio frequency band to intermediate frequency band, a variable gain amplifier 5 amplifying an intermediate frequency band signal, and a gain controller 6 controlling the variable gain amplifier 5. Furthermore, the radio communication receiver of the present invention comprises a gain limiter 7 restricting the amplitude of the gain control signal F generated from the gain controller 6. This gain limiter 7 inputs a hopping timing signal G representative of switching of transmitter antenna or carrier frequency, which is reproduced from an input signal. The gain limiter 7 monitors the intermediate frequency band signal D converted by the frequency converter 4 and the gain control signal F transmitted from the gain controller 6 to the variable gain amplifier 5.

According to above-described radio communication receiver embodying the present invention, the antenna 1 receives the radio frequency band signal A sent from a transmitter (not shown), and outputs this radio frequency band signal A to the receiver filter 2. The receiver filter 2 extracts a desired radio frequency band signal B from the input radio frequency band signal A, and outputs this desired radio frequency band signal B to the first-stage amplifier 3. The first-stage amplifier 3 amplifies the extracted radio frequency band signal B, and outputs an amplified signal C to the frequency converter 4. The frequency converter 4 converts the radio frequency band signal C to an intermediate frequency band signal D, and outputs the intermediate frequency band signal D to the variable gain amplifier 5.

The variable gain amplifier 5 amplifies the intermediate frequency band signal D by varying its amplification factor according to the gain control signal F supplied from the gain controller 6, and generates an IF (intermediate frequency) signal E which is delivered to a next-stage circuit (not shown) and the gain controller 6. Under the restriction of the gain limiter 7, the gain controller 6 outputs the gain control signal F to the variable gain amplifier 5 to control the amplification factor of the variable gain amplifier 5 in such a manner that the IF signal E is maintained at a constant value.

Upon receiving the hopping timing signal G, the gain limiter 7 outputs a limiting signal H to the gain controller 6. This limiting signal H restricts the amplification factor of the variable gain amplifier 5 in such a manner that the amplification factor remains within a range defined by predetermined upper and lower limit values.

To determine these upper and lower limit values, the gain limiter 7 monitors the level of input signal D of each transmitter antenna (or carrier frequency) and the gain control signal F. Based on the level of input signal D and the gain control signal F thus monitored, the upper and lower limit values corresponding to each transmitter antenna (or carrier frequency) are carefully determined so that the amplitude of IF signal does not exceed the dynamic range of the circuit following the automatic gain control circuit at the time of switching of transmitter antenna (or carrier frequency). Thus, it becomes possible to prevent the signal from causing distortion. Furthermore, in determining these upper and lower limit values corresponding to each transmitter antenna (or carrier frequency), it is taken into consideration that too much smallness of signal deteriorates accuracy in the circuit following the automatic gain control circuit. Once the upper and lower limit values are obtained for each of transmitter antenna (or carrier frequency), these upper and lower limit values are used every time the same antenna or carrier frequency is selected later.

Accordingly the gain controller 6, outputting the gain control signal F whose amplitude is restricted by the gain limiting signal H, controls the amplification factor of the variable gain amplifier 5 in such a manner that an average value of the IF signal E remains within a predetermined range determined for each transmitter antenna (or carrier frequency).

FIG. 2 shows the relationship among the desired radio frequency band signal B, the gain control signal F and the IF signal E, in a case that the transmitter antenna hopping number is 2. The amplitude of the gain control signal F is strictly limited to vary within a range defined by the predetermined upper and lower limit values which are given by the gain limiter 7 and differentiated according to the kind of transmitter antenna.

According to the transmitter antenna hopping system, the amplitude of desired radio frequency band signal B possibly varies widely. The automatic gain amplification apparatus explained in this embodiment, however, can restrict the amplitude of gain control signal F between the predetermined upper and lower limit values. Therefore, even immediately after the transmitter's antenna is switched, the amplitude of gain control signal F does not vary largely. Thus, it becomes possible to quickly respond to the change of input signal. Hence, the variable gain amplifier 5 is prevented from excessively reducing the amplitude of a small-amplitude signal or excessively increasing the amplitude of a large-amplitude signal, thereby solving the problem of the conventional system.

In this manner, restricting the amplitude of gain control signal F enables the system to respond within a short time to the sudden change of input signal due to switching of transmitter antenna or the like, although the width of average of IF signal E during the reception of a signal transmitted from one transmitter antenna is slightly widened. When evaluated in total, it is concluded that the IF signal E is more stabilized.

Therefore, it becomes possible to realize an automatic gain control system which prevents the amplitude of IF signal from exceeding the dynamic range of the circuit following the automatic gain control circuit at the time of switching of transmitter antenna (or carrier frequency), or prevents the accuracy of the circuit following the automatic gain control circuit from being deteriorated due to too much smallness of signal.

It is possible to apply constant upper and lower limit values to the amplitude of the gain control signal F irrespective of the kind of transmitter antenna or carrier frequency.

As explained in the foregoing description, the present invention enables an automatic gain control apparatus to quickly respond to the change of input signal level derived from switching of transmitter antenna or frequency hopping etc. Therefore, communication quality is increased and an enlargement of dynamic range in the circuit following the gain control circuit is not necessary.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. An automatic gain control apparatus used in a radio communication receiver system employing a transmitter antenna hopping to flexibly select an optimum transmitter antenna among a plurality of antennas or a frequency hopping to flexibly select an optimum carrier frequency band among a plurality of frequencies, the apparatus comprising:
    variable gain amplification means for receiving a radio frequency band signal from a transmitter antenna and adjusting an amplification factor of the radio frequency band signal;
    gain control means for receiving an output of said variable gain amplification means and outputting a gain control signal to said variable gain amplification means to maintain said amplification factor of said variable gain amplification means within a predetermined range; and
    gain limiting means for monitoring a switching of a transmitter antenna or a carrier frequency band and outputting a limiting signal to said gain control means to restrict a magnitude of said amplification factor within the predetermined range.

2. The automatic gain control apparatus of claim 1, wherein said gain limiting means restricts an upper limit and a lower limit of said amplification factor.

3. The automatic gain control of claim 2, wherein said gain limiting means varies said predetermined range in response to a signal representative of switching of a transmitter antenna among said plurality of antennas through which said signal is transmitted or switching of a carrier frequency among said plurality of frequencies on which said signal is carried.

4. The automatic gain control of claim 1, wherein said gain limiting means varies said predetermined range in response to a signal representative of switching of a transmitter antenna among said plurality of antennas through which said signal is transmitted or switching of a carrier frequency among said plurality of frequencies on which said signal is carried.

5. The automatic gain control apparatus of claim 1, wherein said gain limiting means restricts the amplification factor of said variable gain amplification means prior to said switching of the transmitter antenna or carrier frequency, thereby preventing the output of said variable gain amplification means from exceeding a predetermined when the level transmitter antenna or the carrier frequency band is switched.

6. The automatic gain control apparatus of claim 5, wherein the predetermined range set by said gain limiting means is differentiated in accordance with the type of transmitter antenna or carrier frequency band selected.

7. The automatic gain control apparatus of claim 5, wherein said gain limiting means receives a hopping timing signal representative of a switching of the transmitter antenna or the carrier frequency band.

8. The automatic gain control apparatus of claim 1, wherein said gain limiting means restricts the amplification factor of said variable gain amplification means prior to said switching of the transmitter antenna or the carrier frequency band, thereby preventing the output of said variable gain amplification means from being saturated which causes a distortion when the transmitter antenna or the carrier frequency band is switched.

9. The automatic gain control apparatus of claim 8, wherein the predetermined range set by said gain limiting means is differentiated in accordance with the type of transmitter antenna or carrier frequency band selected.

10. The automatic gain control apparatus of claim 8, wherein said gain limiting means receives a hopping timing signal representative of switching of the transmitter antenna or carrier frequency band.

11. The automatic gain control of claim 1, wherein said gain limiting means receives and monitors said radio frequency band signal transmitted by said transmitter antenna and said gain control signal generated from said gain control means to determined said predetermined range.

* * * * *